United States Patent [19]
Balch et al.

[11] Patent Number: 5,148,101
[45] Date of Patent: Sep. 15, 1992

[54] METHOD AND APPARATUS FOR DETECTING AND COMPENSATING FOR REVERSE ROTATION AND CREEP OF EDDY CURRENT DISK

[75] Inventors: Richard A. Balch, North Hampton; David D. Elmore, Somersworth, both of N.H.

[73] Assignee: General Electric Company, Somersworth, N.H.

[21] Appl. No.: 670,512

[22] Filed: Mar. 18, 1991

Related U.S. Application Data

[63] Continuation of Ser. No. 505,204, Apr. 5, 1990, abandoned.

[51] Int. Cl.⁵ .................. G01R 11/17; G01R 11/32
[52] U.S. Cl. .................... 324/137; 324/110; 324/116; 324/142; 250/231.14
[58] Field of Search ............ 324/137, 138, 103 R, 324/110, 116, 142, 175; 250/231.14, 231.15, 231.16, 231.18; 377/33, 34, 53; 364/483

[56] References Cited

U.S. PATENT DOCUMENTS

| | | | |
|---|---|---|---|
| 4,034,292 | 7/1977 | McClelland, III | 324/137 X |
| 4,194,184 | 3/1980 | Hartmann et al. | 250/231.14 X |
| 4,321,531 | 3/1982 | Marshall | 324/137 X |
| 4,489,384 | 12/1984 | Hurley et al. | 324/137 X |
| 4,665,358 | 5/1987 | Bullock et al. | 324/103 R |
| 4,774,494 | 9/1988 | Extance et al. | 250/231.14 X |
| 4,827,123 | 5/1989 | Gray | 250/231.14 |
| 5,066,906 | 11/1991 | Moore | 324/142 |

*Primary Examiner*—Jack B. Harvey
*Attorney, Agent, or Firm*—John S. Beulick

[57] ABSTRACT

An apparatus and method to detect and avoid inaccuracies in an electronic energy meter due to reverse rotation of the eddy current disk in response to pull-back and creep of the disk, or tampering, including the detection of reverse rotation by checking each three successive states of light transmission between two light emitter/detector pairs in response to an optical castellated disk passing between the emitter/detector pairs, storing pulses generated by the reverse rotation and subtracting the stored pulses upon a subsequent reversal of rotation to the forward direction. Upon reverse rotation in excess of one revolution, the stored pulses are counted along with the counting of the additional reverse rotation pulses and an error signal is generated for subsequent display in response to a command signal.

31 Claims, 6 Drawing Sheets

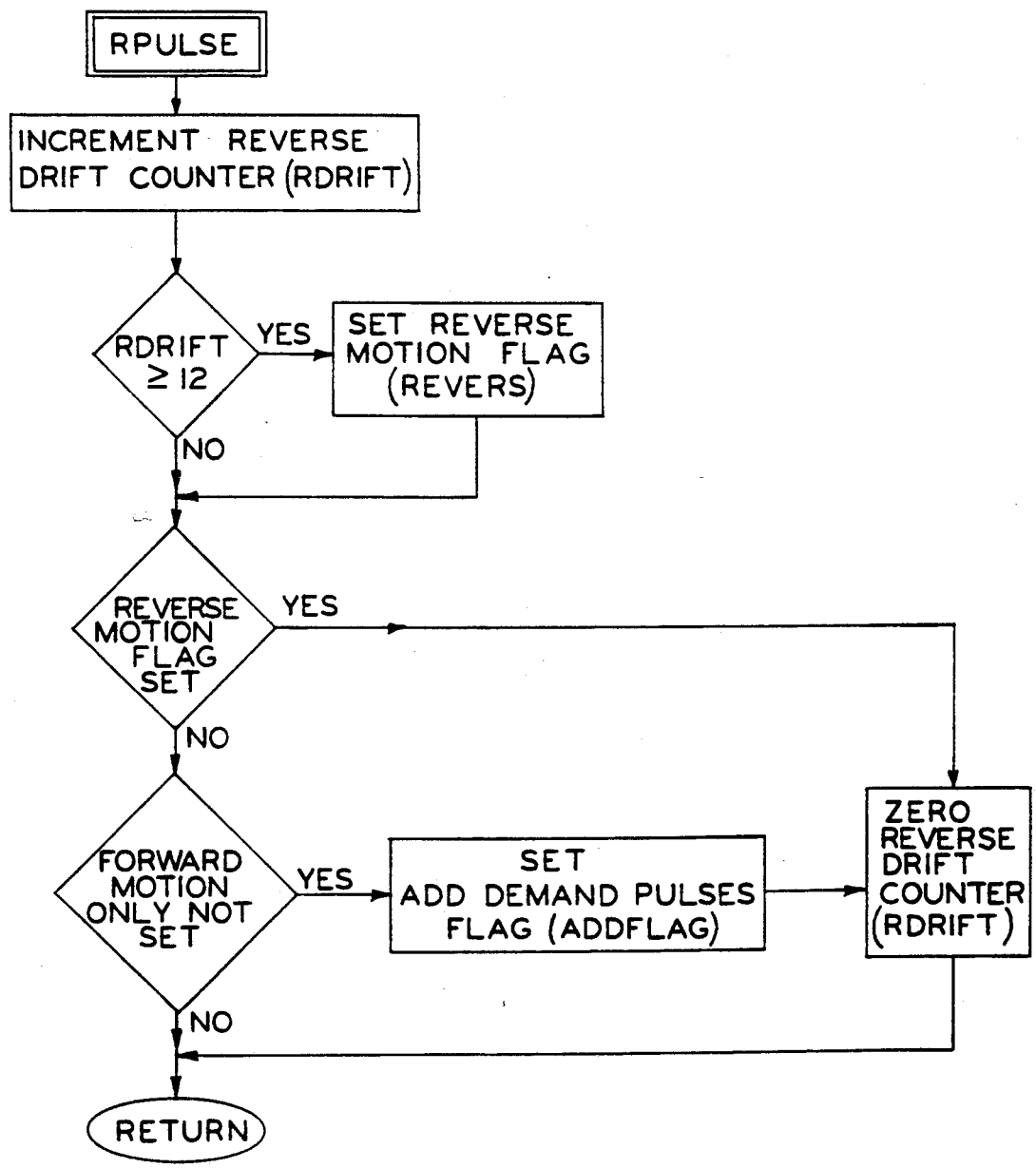
FIG_8

METHOD AND APPARATUS FOR DETECTING AND COMPENSATING FOR REVERSE ROTATION AND CREEP OF EDDY CURRENT DISK

This application is a continuation of application Ser. No. 07/505,204, filed Apr. 5, 1990, now abandoned.

BACKGROUND OF INVENTION

The present invention relates to an electric energy meter, and more particularly to a method and apparatus for detecting and compensating for reverse rotation and creep of the energy meter eddy current disk.

Induction watthour meters conventionally utilize the rotation of an eddy current disk in response to the rate of power consumption by the load on the lines being metered, which is then totalized or integrated as a measure of power consumption, usually expressed in kilowatt hours. Such induction watthour meters commonly include electronic registers for providing time of use or demand energy information which is also used for billing purposes. In such electronic registers, a series of electrical pulses is used to provide an electrical signal responsive to the rate of energy consumption. This is usually achieved by mounting a castellated or toothed optical shutter on the eddy current disk shaft of the energy meter for rotation with the shaft, and positioning a light source and a light detector on opposite sides of the shutter. The toothed shutter interrupts the light path between the light source and the light detector as it rotates between them and provides pulses at a rate proportional to the rate of energy consumption by the load on the power lines being metered. U.S. Pat. No. 4,665,358, issued May 12, 1987, to D. F. Bullock, F. Y. Simon and R. G. Farnsworth, assigned to the same assignee as the present invention, and hereby incorporated by reference, discloses one electro-optical method of determining the direction of rotation in an electric energy meter based on frequency and/or phase differences, and comparison of a new and a preceding state. The present invention constitutes an improvement, and extension of the use, over that disclosed in the aforesaid U.S. Pat. No. 4,665,358.

There are typically one or two anti-creep holes provided in a single-phase energy meter eddy current disk to lock the disk in a fixed rotational position in the absence of energy comsumption by the load being metered until dislodged by a substantial torque upon the resumption of energy consumption by the load being metered. In a properly adjusted energy meter, the two anti-creep holes prevent the eddy current disk from turning more than 180 degrees when power is not being consumed, and also prevents disk "pull-back" of more than 180 degrees after current has been removed. However, a meter can be improperly adjusted such that one of the anti-creep holes is not effective. This would allow the disk to move almost 360 degrees when power is not being consumed or when the load current has been removed. Under such conditions, it is possible that the rotational pulses from the electronic register may be counted twice, once when the eddy current disk pulls back or creeps in the reverse direction, and again when the disk moves forward through the portion of the reverse rotation back to the original position where the reversal began. Since the number of pulses counted is used in determining customer billing, it is very important that energy meters used for billing purposes be highly accurate and avoid billing errors. In addition, it is desirable not only to compensate for errors due to "pull-back" and creep of the eddy current disk, but to accomplish this without adding additional components or increasing the manufacturing time or expense.

In addition, persons tampering with an energy meter have been known to reverse the connections of the energy meter and to employ other methods designed to cause the eddy current disk of the energy meter to rotate in the direction which is the reverse of normal rotation. Such a reversal for a portion of a billing period can cause a subtraction from the meter reading resulting in a lower, but false, indication of the amount of energy consumed, and leading to a lower bill than appropriate for the actual energy consumed. On the other hand, there are installations where reverse flow of current in an energy meter can be encountered in normal operation. Accordingly, it becomes important to detect and meter the reversal of rotation of an energy meter for an extended amount, that is an amount in excess of the smaller amount of reverse rotation resulting from pull-back, chatter, or creep of the eddy current disk. In addition, correction of the readings to eliminate the effects of pull-back and creep is also desirable.

OBJECTS AND SUMMARY OF INVENTION

It is an object of the present invention to correct for creep and chatter of the eddy current disk in an energy meter.

It is another object of the present invention to correct for the "pull-back" of an eddy current disk in an energy meter.

It is yet another object of the present invention to correct for both pull-back, chatter and creep of the eddy current disk in an energy meter, without additional cost of manufacture or of components.

It is still another object of the present invention to provide an error signal indicating possible tampering, and to record the amount of reverse rotation when the eddy current disk in an energy meter rotates more than one revolution in the reverse direction.

In accordance with one embodiment of the present invention, an electric energy meter includes two or more light emitter/detector pairs with a rotating castellated shutter positioned between the pairs and coupled for rotation with the eddy current disk in response to energy consumption being metered. A method is provided to compensate or correct for inaccuracies resulting from reverse rotation of the eddy current disk due to pull-back, chatter, creep, or tampering with the energy meter. A first signal is provided in response to each change in the state of transmission received by the light emitter/detector pairs upon rotation of the teeth of the castellated shutter between the light emitter detector pairs, the pulses are stored, and successive states of transmission are compared, with a pulse generated for counting only when going through the correct series of three successive states. A reversal of rotation is detected upon going through the reverse repetition of the series of three consecutive states.

In one embodiment of the present invention all reverse rotation pulses are not counted, and counting is resumed only when a reversal of rotation to the forward direction is again detected. This avoids double counting of pulses due to the limited amount of pull-back or creep of the eddy current disk until stopped by the anti-creep holes in the eddy current disk.

In an alternate embodiment of the present invention, upon detection of reverse rotation, the pulses are stored for up to a full revolution of reverse rotation. Detection of subsequent reversal of rotation to the forward direction is used to subtract pulses from the stored pulses until the original position of reverse rotation is reached, at which point the stored pulses equal zero, the storage circuit is reset, and forward rotation pulses are again counted. However, if the reverse rotation continues beyond a full revolution, a possible cause is meter tampering in which case an error signal is generated, the stored signals for the full revolution are counted, and the energy meter continues counting as valid the additional pulses resulting from continued reverse rotation. The error signal is stored, and subsequently downloaded from the microprocessor for display at the computer in the office of the power company for appropriate action regarding possible tampering.

DRAWINGS AND BRIEF DESCRIPTION OF INVENTION

FIG. 5, 6, 7 and 8 are block diagrams useful in explaining the procedure and method used in detecting and correcting for reverse rotation errors in the meter.

Figure 1:
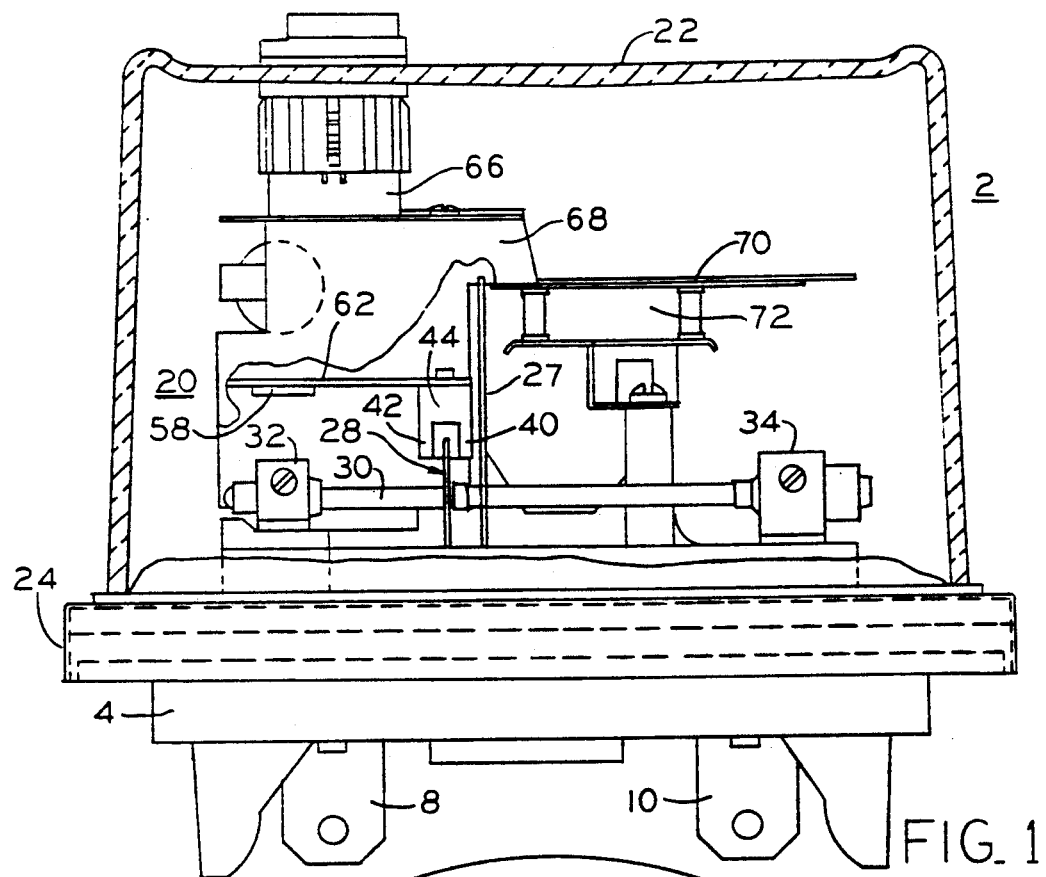
FIG. 1 is a side view of a watthour meter including an electronic time of use or demand register incorporating one embodiment of the present invention.

Referring first to FIG. 1, an electronic energy or power meter 2 is shown in simplified form and includes a base 4 having a plurality of circuit terminals such as 8 and 10 extending through the base to connect the meter in circuit with a power source and a load which is to be metered. An electronic register assembly 20 is positioned remote from the base 4 and meter circuit terminals 8 and 10, and the internal electronics and mechanisms of the energy meter 2 are enclosed by a transparent cover 22 which is secured to the base 4 by a locking ring 24. A circular eddy current disk 27 is supported on shaft 30 for rotation within bearings 32 and 34 in response to electric power supplied to, and consumed by, a load which is to be metered. In a manner well known in the art, the eddy current disk 27 is caused to rotate at a speed proportional to the energy provided to the load to which the energy meter 2 is connected, and the watthour meter integrates the revolutions of the eddy current disk through gearing 72 as a measure of power consumption. The present invention is suitable for use with the combination watthour meter and electronic register which is described in copending U.S. patent application Ser. No. 07/505,195 of A. A. Keturakis, S. D. Velte, J. G. Russillo, Jr., and R. A. Balch, and the associated patent applications referenced therein, all of which are assigned the same assignee as the present invention and are hereby incorporated by reference.

Figure 2:
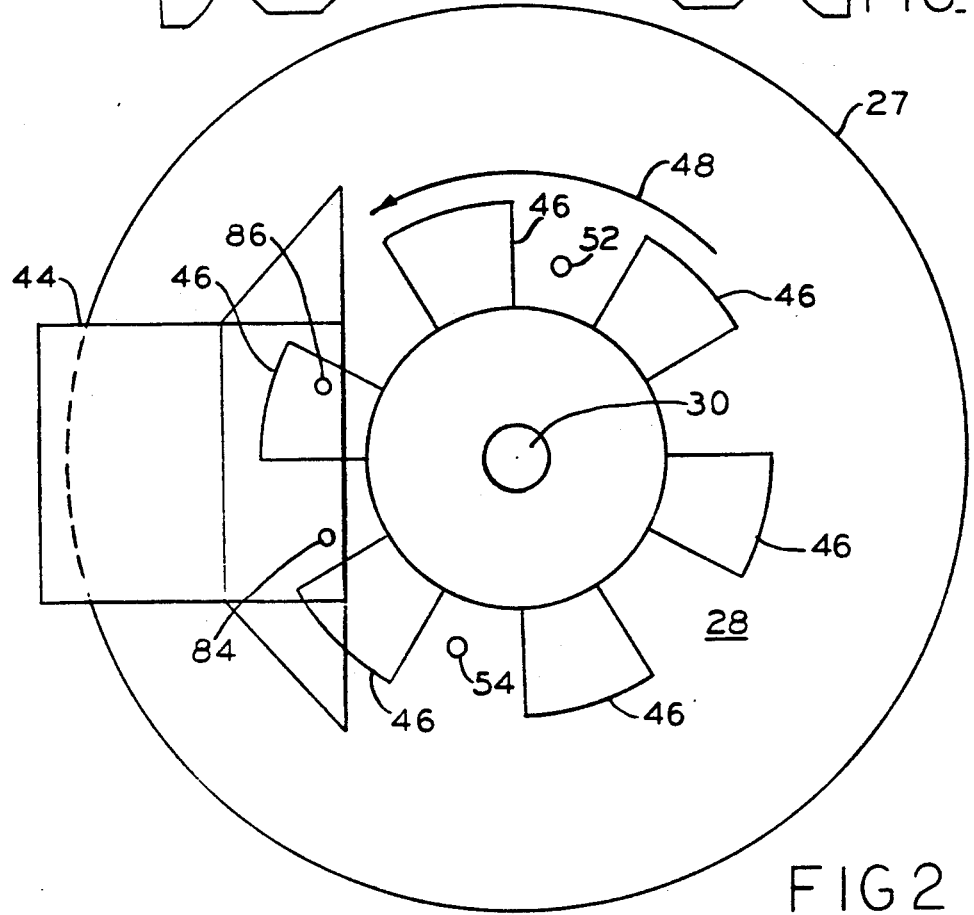
FIG. 2 is a simplified top view of the disk sensing optics utilized in the present invention.
Figure 3:
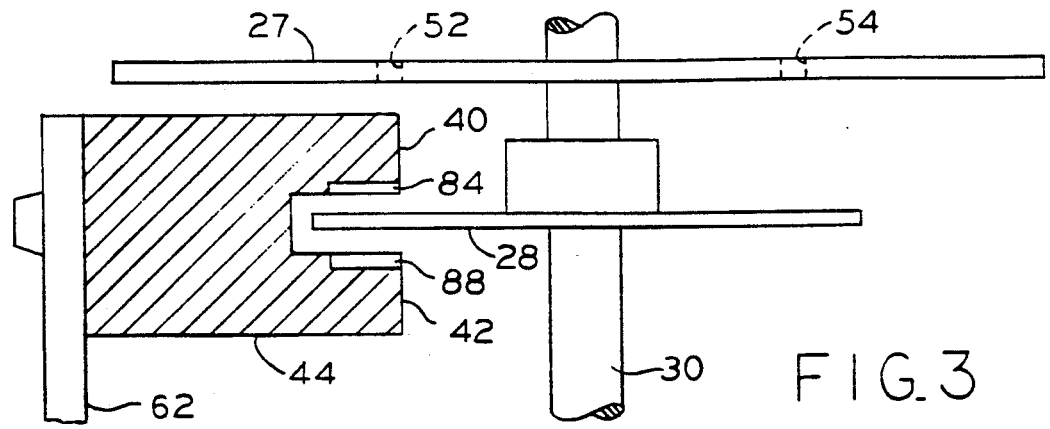
FIG. 3 is a side view of FIG. 2.
Figure 5:
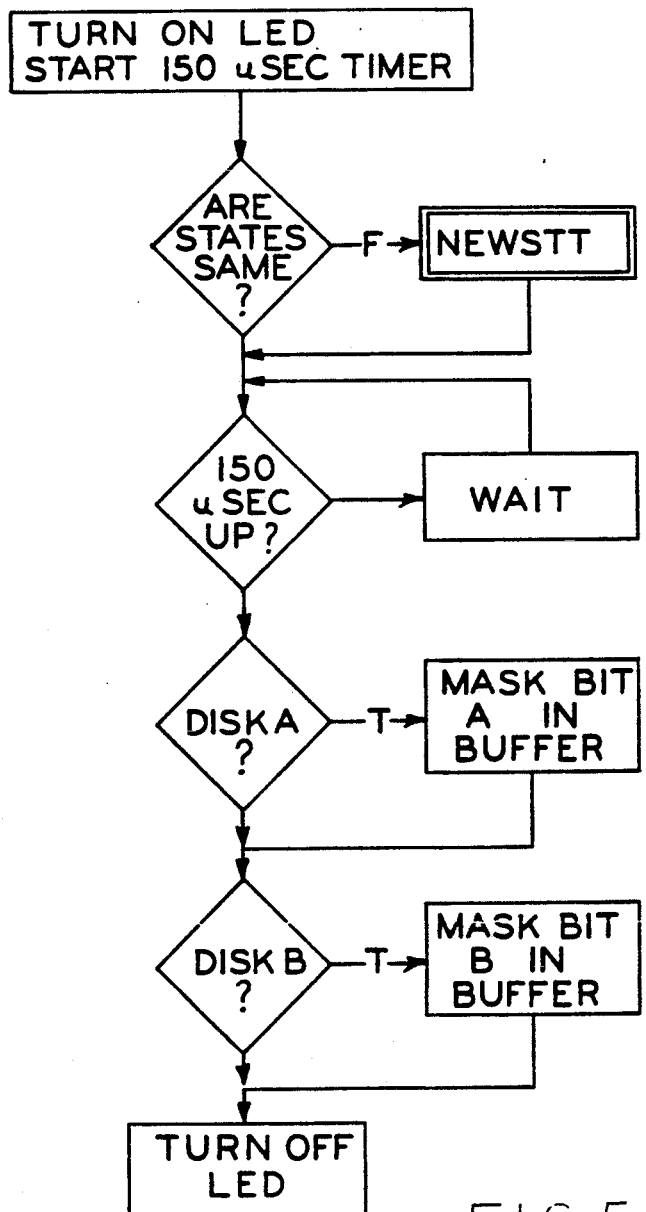

As shown in FIGS. 1, 2, and 3, also mounted on shaft 30 is the optical shutter 28 for rotation between spaced jaws 40 and 42 of the disk sensing optics assembly 44. As best shown in FIG. 2, the optical shutter 28 is castellated, and includes a plurality of radially extending teeth 46 which sequentially pass between the spaced jaws 40 and 42. Positioned within the spaced jaws 40 and 42 are two light emitters 84 and 86, and paired light detectors 88 and 90, respectively, which are in the path of the teeth 46 such that upon rotation of the shutter 28 in the direction shown, for example, by arrow 48, the teeth will sequentially rotate past one light emitter and detector pair 86, 90, and then past the second light emitter and detector pair 84, 88. The arcuate length of the teeth 46 is less than that between the light emitter/detector pairs 84, 88 and 86, 90. As a result, light transmissions from each pair of light emitters or light emitting diodes (LEDs) to the light detectors is interrupted every time a tooth 46 passes between the jaws.

The disk sensing optics assembly 44 is secured to the register printed circuit board 62 within the register enclosure 68 of register 20. An optical readout or port 66 is used for optical communications between the register 20 and the outside of the energy meter 2 for readout purposes, and also to program the time of use or demand register 20 from outside the energy meter. Details of the optical readout 66 is described in copending U.S. patent application Ser. No. 07/505,970 of A. A. Keturakis and S. D. Velte, details regarding the construction and assembly of the disk sensing optics assembly 44 are described in copending U.S. patent application Ser. No. 07/505,383 of A. A. Keturakis, R. C. Mayo, and S. D. Velte, and details regarding the processing of the signals generated by the electronic register 20 are described in copending U.S. patent application Ser. No. 07/505,203 now U.S. Pat. No. 4,973,901 of R. A. Balch, all of which are assigned to the same assignee as the present invention, and are hereby incorporated by reference.

Referring to FIGS. 2 and 3, the eddy current disk 27 includes a pair of anti-creep holes 52 and 54 which are diametrically opposed about shaft 30 and which are designed to prevent the eddy current disk from turning more than 180 degrees when power is not being consumed by the load being metered, and to prevent disk pullback of more than 180 degrees after load current has ceased flowing through the energy meter 2. The anti-creep holes 52 and 54 disturb the magnetic field present in the energy meter 2 to prevent the rotation of eddy current disk 27 past the anti-creep holes under conditions of pull-back and creep in a manner well-known in the art. In accordance with the present invention, pulses are detected indicating an interruption of the light transmission between the light emitters 84, 86 and the light detectors 88, 90, and the direction the disk is turning is determined. A determination is then made whether the detected pulses should be counted for billing purposes because of energy consumption by the load being metered, or whether they should be discounted because of disk creep, or chatter, or disk pull-back. The electrical pulses generated by the disk sensing optics assembly 44 are provided to the microprocessor 58 on the register circuit board 62 for counting, storage, and subsequent downloading through the optical readout 66.

In the following discussion the light emitter and light detector pair 84, 88 is identified as DISKA, and the light emitter and light detector pair 86, 90 is identified as DISKB. The two light emitter/light detector pairs, DISKA and DISKB, and the microprocessor 58 detect the direction and rate of rotation of the six toothed shutter 28 by detecting whether the light detectors 88 and 90 are off, or on. The off condition (logic 1) indicates a tooth 46 of shutter 28 in the path of the light detector/emitter pair. The on condition (logic 0) indicates a tooth 46 is not in the path of the light detector/e- mitter pair, and hence the light detector is receiving light transmission from its associated light emitter.

Figure 4:
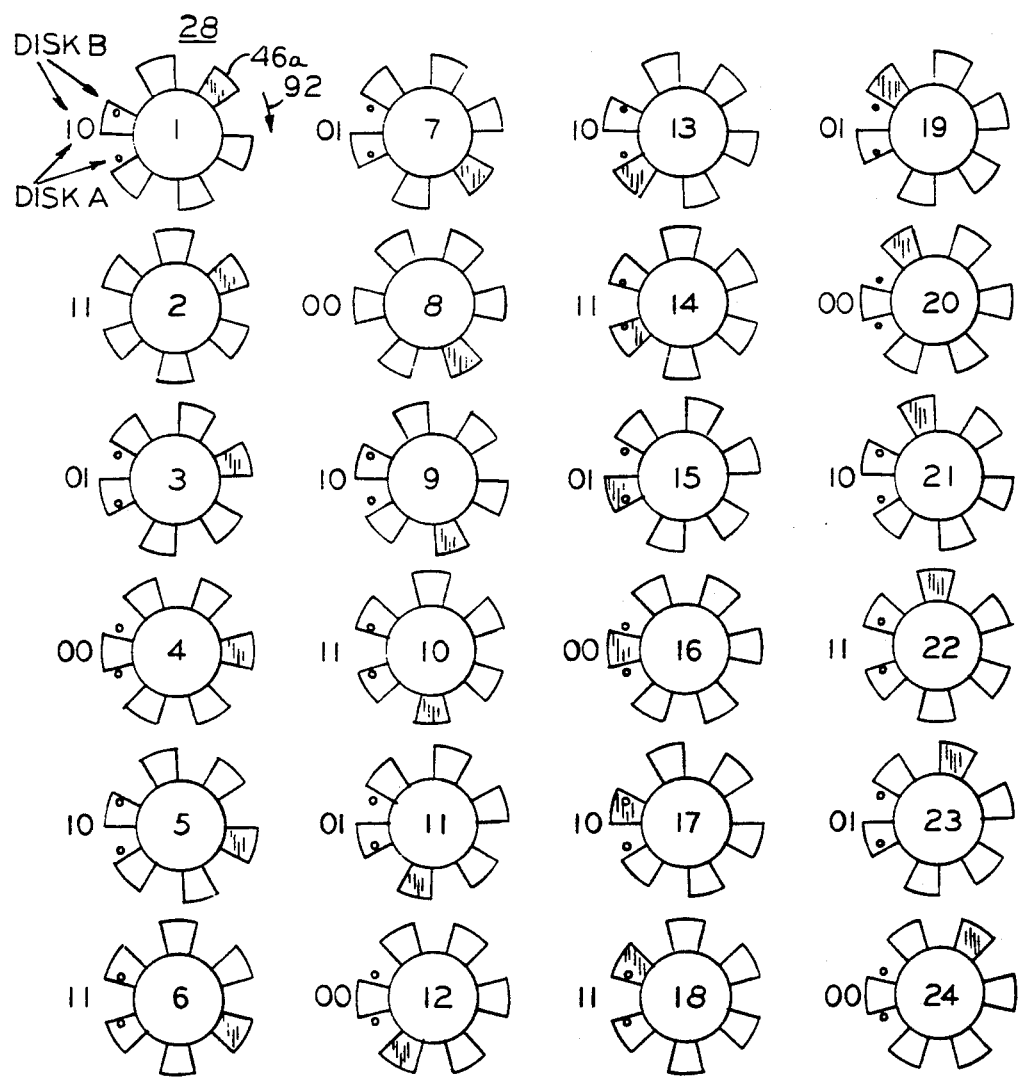
FIG. 4 illustrates the output of the disk sensing optics as viewed from the bottom under various states or conditions.
Figure 6:
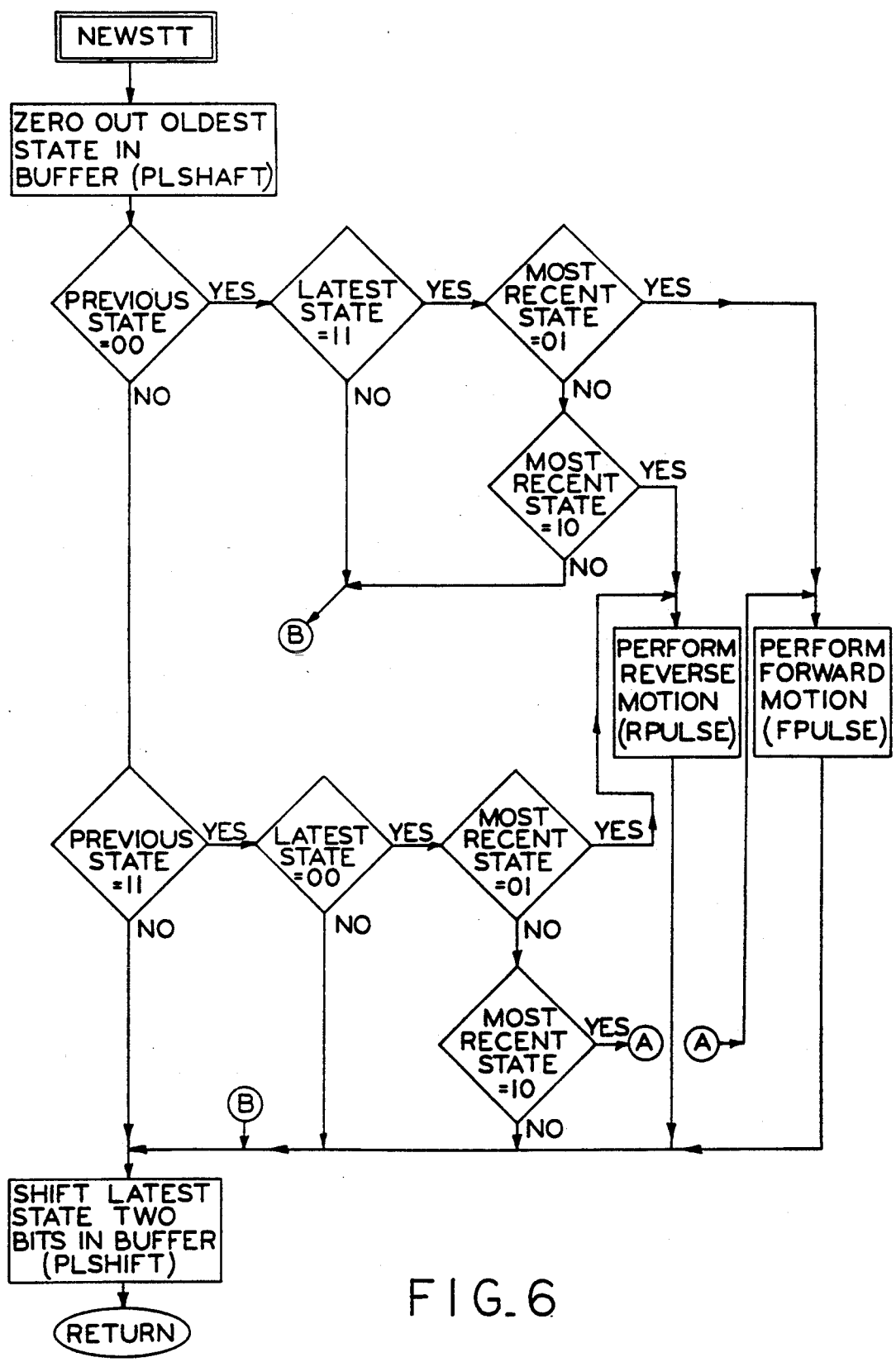

Referring next to FIG. 4, FIG. 4 shows the various positions, or states, of a single rotation of shutter 28 and its light transmission and interruption effects on DISKA and DISKB. It is to be noted that there are twenty-four states in a complete rotation of the optical shutter 28. The states are numbered in the central region of each diagram and as a guide to the position shown in each state, the tooth 46a is shaded differently in FIG. 4 than the other teeth 46. In sequentially moving through states one to twenty-four, it is to be noted that tooth 46a makes a complete revolution. Since there are six teeth, and two light emitter/detector pairs (DISKA and DISKB), and two states (off or on) for each light emitter/detector pair, there are twenty-four possible states; that is, six times two times two equals twenty-four.

FIG. 4 illustrates all twenty-four of the possible different states with each successive state representing a sufficient amount of rotation to cause a change in the light transmission to either DISKA or DISKB. It is to be noted that the width of a tooth 46 is less than the distance between the light emitter/detector pairs DISKA and DISKB. The starting state 1 may be arbitrarily located and defined, and as shown in FIG. 4, in state 1 DISKA is not covered by a tooth 46 and accordingly is in the conducting, or on, condition which is logic 0; while DISKB is covered by a tooth and hence is in the non-conducting, or off, condition which is logic 1. This is indicated in the table at the bottom of FIG. 4 in which the logic 10 for state 1 indicates that DISKB is logic 1 while DISKA is logic 0. Looking next at state 2, it is seen that the shutter 28 has rotated sufficiently clockwise as shown by arrow 92, that is, in the reverse direction, such that both DISKA and DISKB are covered by adjacent teeth such that both are non-conducting, or in the off condition, and hence both are logic 1. The table at the bottom indicates that state 2 is logic 11 for DISKB and DISKA respectively. State 3 shows further rotation of the shutter 28 next uncovers DISKB, while DISKA remains covered, presenting a DISKB-DISKA logic of 01 which is set forth in the tabular logic representation under state 3. State 4 represents further rotation in which DISKA and DISKB are next both uncovered, allowing the light transmission from the light emitters 84, 86 to reach light detectors 88, 90 placing both DISKB and DISKA in the conducting, or on, condition which is logic 0, and hence the tabular representation lists state 4 as 00. Still further rotation of the shutter 28 provides the next state 5 where DISKB is covered and hence in the off condition or logic 1, and DISKA is uncovered and hence in the on condition or logic 0. State 5 accordingly provides a logic of 10 for DISKB and DISKA as indicated in the table. Proceeding in a similar manner for all twenty-four states which would cover a full rotation of 360 degrees provides the pictorial representations shown by the shutter 28, and the tabular logic representation shown by states 1-24 at the bottom of FIG. 4.

Figure 7:
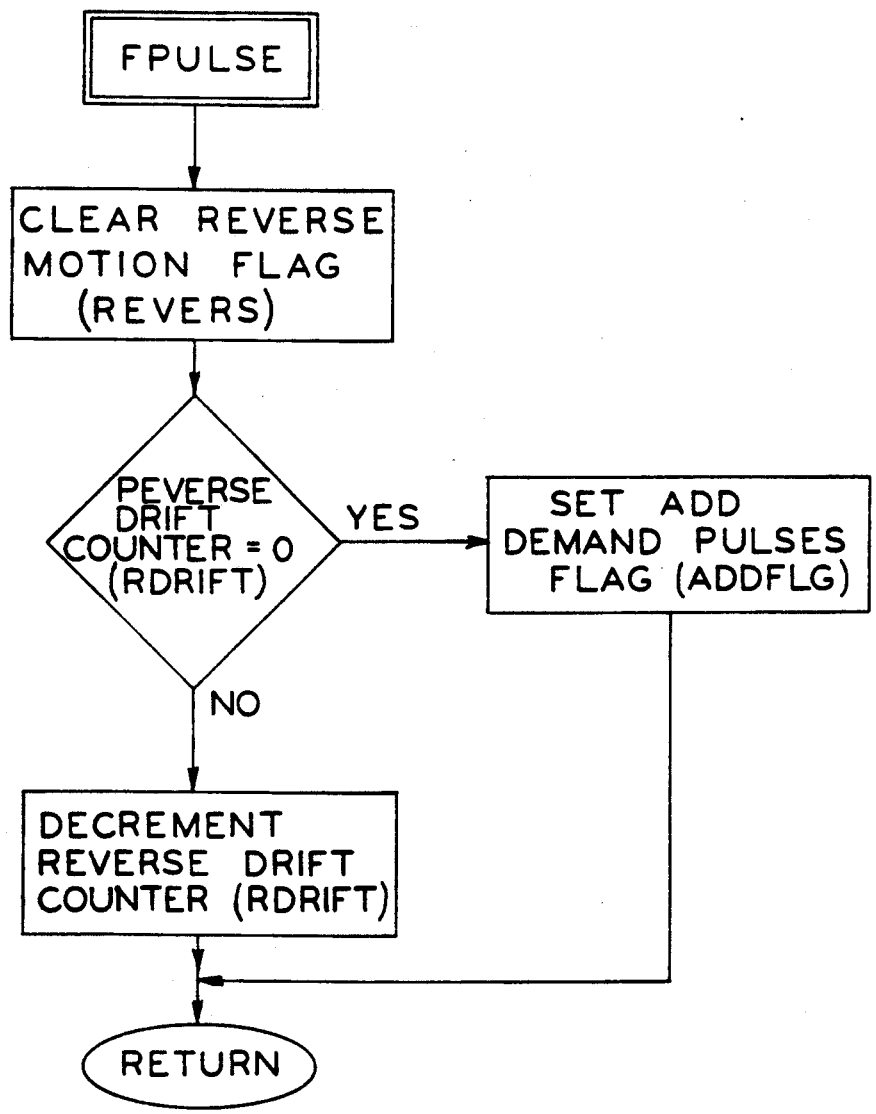

FIGS. 5, 6, 7 and 8 are block diagrams setting forth a pictorial representation useful in understanding the method of compensating for errors due to reverse rotation of the eddy current disk 27 in accordance with the present invention. FIG. 7 shows details of the Perform Forward Motion (FPULSE) step of FIG. 6, while FIG. 8 shows the Perform Reverse Pulse step of FIG. 6. Referring to FIGS. 5, 6, 7 and 8, the full 24 state tabular representation at the bottom of FIG. 4, and the algorithm set forth below, it is to be noted that during a continuing forward rotation of disk 28, the disk goes through a sequence of three different states no matter what position is selected as the starting position. For example, moving in the forward direction through states 3, 2, and 1, the DISKB-DISKA logic is 01, 11 and 10, which are three different states and represent a valid forward rotation of the disk 28. If the disk 28 were to creep or pull back, in the opposite or reverse direction, the logic upon change of direction would change from one state to the next, then revert back to the original state, that is the third state in such a three state sequence would be the same as the first state. For example, if the rotation should reverse at state 1, the DISKB-DISKA logic would be 11 (for state 2) then 10 (for state 1) and then 11 (repeating state 2). That is, in a sequence of 3 states, 2 of the states would be the same, namely 11, and this establishes a reversal of rotation which is detected by the microprocessor 58 which includes an associated counter.

As a result, and in accordance with the present invention, the pulse as detected is considered valid only when rotation of disk 28 provides a sequence of three different states. Stated another way, the three states which are continuously read are the oldest state, the previous state, and the current state, with the current state being the state of DISKA and DISKB the last time the optics were sampled, and the three states are the previous three states at any given time. When all three are different, and in accordance with the present invention, a pulse is counted and the logical conclusion is that the optical shutter 28 has continued rotation during the three pulses in a single direction, and that there has been no reversal of direction.

The present invention includes two modes of pulse counting. In the first, or Bi-directional Mode, a pulse is counted each time a valid pulse is detected no matter the direction of rotation. The direction of rotation does not matter as long as the microprocessor receives a sequence of three different states indicating a valid pulse. This will insure that extra pulses are not caused because of disk chatter in which the disk moves back and forth around a given position, or from a slowly moving disk. Under such conditions, alternate states are the same and valid pulses are not generated, and hence are not counted.

However, because there are only two anti-creep holes 52 and 54 in the eddy current disk 27, the disk can "pull back" close to 180 degrees after current has been removed. To make sure that pulses are not counted twice for the intervening states, once when the disk pulls back through a number of states, and again when the disk moves forward through the same states, means are provided to accommodate the "pull-back" of the disk without counting such pulses twice.

In a properly adjusted meter 4, the two anti-creep holes 52 and 54 will prevent the eddy current disk 27 from turning more than 180 degrees when power is not being consumed, and also prevents disk "pull back" of more than 180 degrees after current has been removed. However, a meter can be adjusted or mis-adjusted under certain conditions such that one of the anti-creep holes 52 or 54 is not effective. This could allow the eddy current disk 27 to move almost 360 degrees providing the possibility of counting 360 degrees of rotation twice, once when the disk pulls back or creeps in the reverse direction, and again when the disk moves in the forward direction back to the original position when, for example, electric energy is again consumed by the load being metered. It is possible that over a period of time, such as one month between energy meter readings, that a number of double readings of pulses could occur and could result in an accumulated substantial error in the readings of energy meter 2 and in the subsequent billing to the customer for energy not provided. In one typical energy meter 2, an improper addition of a single revolution of eddy current disk 27 would amount to approximately 7.2 watts of error. Accordingly, the present invention detects and accommodates the reverse rotation pull-back and creep of the eddy current disk 27 to make sure that pulses are not generated and counted twice. These errors are compensated for in the Forward Direction Mode or second mode of operation.

As pointed out above, a pulse is counted as valid only when the current state, the previous state and the oldest state are all different and in the correct sequence, the oldest state being the state prior to the previous state. Also, a reversal of the direction of rotation of the eddy current disk 27 is immediately detected by the current state being the same as the previous state or the oldest state.

In the Forward Direction Mode of operation, the counting of pulses is determined by, and based on, whether or not the eddy current disk 27 has been moving only in the forward direction, or both in the forward and reverse directions.

Assume that the eddy current disk 27 has been moving in the forward direction, the reverse of that shown by arrow 92 in FIG. 4, and is currently at state 1. Under these conditions the temporary location at which to count reverse pulses or RDRIFT in microprocessor 58 has been set to zero. If the eddy current disk 27 starts were to continue to rotate in the forward direction, the eddy current disk would consecutively advance through states 24, 23, 22, 21, 20, 19, 18, 17, 16, 15, 14, to 13 which represents six valid pulses or 180 degrees. However, assume instead that the eddy current disk 27 rotates in the reverse direction for 180 degrees. The sequence of states will be (starting with 1), 2, 3, 4, 5, 6, 7, 8, 9, 10, 11, 12 to 13 arriving at the same location with 180 degree reverse rotation. The pulse rotation algorithm for the microprocessor 58 detects and counts the pulses as the eddy current disk 27 passes through the different states in the reverse direction, and continues the counting of a valid pulse upon sequential detection of 3 different consecutive states of DISKB and DISKA. When the eddy current disk 27 moves from state 1 back to state 2 through which it had previously passed, the previous state 2 becomes the current state and reverse rotation is detected, and the pulse detection algorithm for the microprocessor 58 detects the reverse rotation pulses for states 3, 4, 5, et seq, but in this case stores the pulses in RDRIFT. If the eddy current disk 27 should again reverse direction before RDRIFT=12, the subsequent valid pulses generated by the eddy current disk rotating in the forward direction will be subtracted from RDRIFT until RDRIFT is zero. If the forward rotation of the eddy current disk 27 continues in the forward direction, the reverse pulses or RDRIFT will have been cancelled when the eddy current disk again reaches stage 1, and the reverse rotation pulses will be ignored in the accurate calculation of energy consumption by the load as measured by energy meter 2, and the subsequent billing of the customer.

However, once the eddy current disk 27 has rotated in the reverse direction an amount greater than a full revolution, it is desirable to count the amount of reverse rotation since it likely is a result of tampering with the energy meter 2, such as by reversing the connection of circuit terminals 8 and 10 in the load circuit, and not a result of reversal due to pull-back or creep of the eddy current disk. Accordingly, at the same time an error signal is generated in microprocessor 58 to indicate upon downloading that reverse rotation has exceeded a full revolution.

Assuming, as above, that the eddy current disk 27 has not reversed direction before reaching state 13 after passing through states 2, 3, 4, etc. After moving a full 360 degree revolution in the reverse direction, when RDRIFT equals 12 the reverse direction rotation of eddy current disk 27 will be considered valid, all of the reverse rotation detected and stored valid pulses will be counted, and RDRIFT will be set to zero. As the eddy current disk 27 continues to move in the reverse direction, valid pulses will be counted by the microprocessor 58 as they are detected. Once forward direction rotation, or a further reversal of direction is encountered, by a current and oldest state in a sequence of three states being the same, the algorithm to detect reverse pulses will again start RDRIFT. Pulses will again be counted, but stored in RDRIFT, each time there is rotation through the different states and the sequence described above for initial reverse rotation will commence.

Instead of counting the number of pulses, the algorithm could directly detect the individual states, that is whether the eddy current disk 27 is in state 1, state 2, state 3, state 4, etc., rather than detecting the individual states of conduction of the light emitter/detector pairs. That is, either detection of conduction or state could be used. A reversal would then be a simple reversion to the previously detected state. Thus, if the eddy current disk 27 were at state 12 and had just passed in the forward direction through state 13, the subsequent detection of state 13 would be an indication of a reversal of direction of rotation of the eddy current disk 27 and its associated castellated optical disk 28. The algorithm then would directly determine the action to be taken, such as commencing the counting of the number of reverse states in RDRIFT, and upon a subsequent reversal of rotation of the eddy current disk 27 prior to a full rotation, subtraction of the number of the individual states in the reverse direction until RDRIFT equals zero, followed by the counting of the individual states in the forward direction of rotation. That is, the same type of corrective action could be provided whether the algorithm and microprocessor 58 are counting the individual pulses or the states.

The operation of the light emitter and light detector pairs may be periodically tested as disclosed in detail in copending U.S. patent application Ser. No. 07/505,199 of R. A. Balch, and the details of the disk sensing optics assembly 44 are disclosed in copending U.S. patent application Ser. No. 07/505,383 of A. A. Keturakis, R. C. Mayo and S. D. Velte, both of which are assigned to the same assignee as the present invention and are hereby incorporated by reference.

The algorithm used for the microprocessor 58, to provide the method of compensating for errors, due to reverse rotation of eddy current disk 27 described above and in FIG. 5 is set forth below and is included for completeness of description.

A. Perform Optical Disk Detection (OPTICS)

-continued

```
read current state of optics (DSKA) (DSKB)
*
*
turn on the LED (LED)
start 150 microsecond time (TMODO) (TMO)
*
*
compare latest state to most recent in state buffer (PLSHFT)
IF different
    perform new state (NEWSTT)
ENDIF
wait until 150 microsecond timer runs down (IRQTO)
*
*
read optics and store as latest state
    NUDSKA = DSKA
    NUDSKB = DSKB
*
*
turn off the LED
*
*
END
(The most significant nibble of PLSHFT contains the oldest
state and the previous state.)
(The least significant nibble of PLSGFT contains the most
recent state and the latest state.)
B. Perform New State (NEWSTT)
zero out oldest state in buffer (PLSHFT)
IF most significant nibble = XX 00
    IF least significant nibble = 01 11
        perform forward motion (F PULSE)
    ELSE IF least significant nibble = 10 11
        perform reverse motion (RPULSE)
    ENDIF
ELSE if most significant nibble = XX 11
    IF least significant nibble = 10 00
        perform forward motion (FPULSE)
    ELSE IF least significant nibble = 01 00
        perform reverse motion (RPULSE)
    ENDIF
ENDIF
shift latest state two bits in buffer (PLSHFT)
END
C. Perform Forward Motion (FPULSE)
clear reverse motion flag (REVERS)
IF reverse drift counter (RDRIFT) = 0
    set add demand pulses flag (ADDFLG)
ELSE
    decrement reverse drift counter (RDRIFT)
ENDIF
D. Perform Reverse Motion (RPULSE)
increment reverse drift counter (RDRIFT)
IF reverse drift counter ≧ 12
    set reverse motion flag (REVERS)
    *
    *
ENDIF
IF reverse motion flag (REVERS) or NOT forward motion only
    (DETENT)
    IF NOT forward motion only (DETENT)
        set add demand pulses flag (ADDFLAG)
    ENDIF
    zero reverse drift counter (RDRIFT)
ENDIF
```

The emitter/detector pairs 86, 90 and 84, 88 may utilize the transmission of visible light, infrared light or other form of energy transmission, as long as the directed transmission as detected is interrupted by the teeth 46 of the optical shutter 28.

Thus, while the present invention has been described through preferred embodiments, such embodiments are provided by way of the example only. Numerous variations, changes and substitutions, including those discussed above, will occur to those skilled in the art without departing from the scope of the present invention and the following claims.

What I claim is:

1. In an electronic energy meter for metering electric energy consumption including an eddy current disk rotating in response to energy consumed by the load being metered and provided with one or more anti-creep holes, and a castellated disk including multiple teeth about its periphery coupled for rotation with the eddy current disk and rotating between two pairs of emitters and detectors positioned on either side of the castellated disk with the arcuate width of said teeth being less than the distance between adjacent pairs of said two pairs of emitters and detectors such that rotation of the teeth of the castellated disk interrupts the transmission beams between the two emitter/detector pairs, a method of correcting for inaccuracies in the energy meter microprocessor output which result from eddy current disk reverse rotation in response to pull-back, creep or tampering comprising:

detecting the state of transmission of at least two emitter/detector pairs, said state of transmission being whether a detector is receiving a transmission from its paired emitter;

generating signals in response to each change in the state of transmission between said at least two emitter/detector pairs;

storing and comparing said signals over successive states of transmission;

generating and counting pulses in response to the change in the state of transmission between the at least two emitter/detector pairs only when there has been no repetition of a state in three successive changes of the state of the transmission;

detecting an initial reversal of the rotation of said eddy current disk to the reverse direction of rotation upon a repetition in a sequence of three states of the previous state upon the detection of the next state;

storing the reverse rotation pulses generated during rotation in the reverse direction; and subtracting pulses from the stored reverse rotation pulses upon detection of a subsequent reversal of rotation of said eddy current disk to the forward rotation direction.

2. The method of correcting for reverse rotation inaccuracies in the energy meter of claim 1 including the additional step of resetting the storing of the reverse rotation pulses to zero when said eddy current disk regains the initial position of the reversal of direction of rotation.

3. The method of correcting for reverse rotation inaccuracies in the energy meter of claim 2 including the additional step of storing the reverse rotation pulses until said eddy current disk has rotated a predetermined amount of reverse rotation, at which point the additional step of resetting the storing of the reverse rotation pulses to zero is accomplished without a further reversal of rotation of said eddy current disk.

4. The method of correcting for reverse rotation inaccuracies in the energy meter of claim 3 including the additional step of counting for purposes of energy consumption metering the reverse rotation pulses which have been stored prior to reaching said predetermined amount of reverse rotation of said eddy current disk.

5. The method of correcting for reverse rotation inaccuracies in the energy meter of claim 4 including the additional step of also counting additional pulses of said reverse rotation when said eddy current disk continues rotating past said predetermined amount of reverse rotation.

6. The method of correcting for reverse rotation inaccuracies in the energy meter of claim 5 including the additional step of providing an error signal when said eddy current disk has reached said predetermined amount of reverse rotation.

7. The method of correcting for reverse rotation inaccuracies in the energy meter of claim 6 wherein said predetermined amount is at least one half revolution of rotation, and no more than one full revolution of rotation, of said eddy current disk.

8. The method of correcting for reverse rotation inaccuracies in the energy meter of claim 7 wherein said predetermined amount is one full reverse revolution of said eddy current disk and said error signal is provided when the reverse rotation exceeds that predetermined amount of reverse rotation.

9. The method of correction for reverse rotation inaccuracies in the energy meter of claim 8 wherein pulses are generated and counted upon a subsequent reversal of said eddy current disk to the forward direction from said reverse direction.

10. The method of correcting for reverse rotation inaccuracies in the energy meter of claim 9 wherein said error signal is stored and subsequently displayed upon receipt of a display command signal.

11. The method of correcting for reverse rotation inaccuracies in the energy meter of claim 10 wherein the number of pulses counted for a complete revolution of said eddy current disk is on the order of 12.

12. The method of correcting for reverse rotation inaccuracies in the energy meter of claim 11 including the additional step of periodically testing the operation of said emitter/detector pairs.

13. In an electronic energy meter for metering electric energy consumption including an eddy current disk rotating in response to energy consumed by the load being metered and provided with one or more anti-creep holes, and a castellated disk including multiple teeth about its periphery coupled for rotation with the eddy current disk and rotation between two light emitter/detector pairs positioned on opposite sides of the castellated disk, such that rotation of the teeth of said castellated disk interrupt the light transmitted between the two light emitter/detector pairs, a method of avoiding inaccuracies in the energy meter microprocessor output which result from eddy current disk reverse rotation in response to pull-back, creep and tampering with the energy meter comprising:
providing a first signal in response to each change in the state of transmission of the two emitter/detector pairs, the state of transmission being whether a detector is receiving a transmission from its paired emitter;
storing and comparing successive states of transmission;
generating a pulse in response to the change in the state of transmission between the two emitter/detector pairs only when there has been no repetition of a state in three successive changes of the state of the transmission;
detecting a first reversal of the rotation of said eddy current disk to the reverse rotation direction upon a repetition in a sequence of three states of the previous state upon the detection of the next state;
ignoring all pulses generated after detecting a first reversal of rotation of said eddy current disk;
counting additional pulses only after a second reversal of the rotation of said eddy current disk, said second reversal of rotation being detected upon detection in a sequence of three states of a repetition of the previous state upon detection of the next state;
whereby pulses are counted only for forward rotation of said eddy current disk.

14. The method of avoiding inaccuracies in the energy meter of claim 13 including the additional step of providing an error signal when said eddy current disk has rotated in said reverse direction for a predetermined amount.

15. The method of avoiding inaccuracies in the energy meter of claim 14 wherein said error signal is stored and subsequently displayed upon receipt of a display command signal.

16. The method of avoiding inaccuracies in the energy meter of claim 15 wherein said error signal is used as an indication of possible tampering with said energy meter.

17. The method of avoiding inaccuracies in the energy meter of claim 13 wherein the number of pulses counted for a complete forward revolution of said eddy current disk is on the order of 12.

18. The method of avoiding inaccuracies in the energy meter of claim 17 including the additional step of periodically testing the operation of the light transmission between said light emitter/detector pairs.

19. The method of avoiding inaccuracies in the energy meter of claim 18 wherein the eddy current disk includes a plurality of anti-creep holes which limit reverse rotation due to pull back and creep to no more than one revolution of the eddy current disk.

20. Apparatus, comprising:
rotatable means including a plurality of spaced signal transmission regions and a plurality of spaced signal intercepting means;
first emitter means for emitting a first disk position signal, the first emitter means disposed so that as said rotatable means rotates, respective signal intercepting means successively intercept the first disk position signal, said first emitter means being operable in a pulsed mode;
first detector means for detecting transmission of the first disk position signal between respective intercepting means, the first detector means disposed so that the intercepting means rotate between said first emitter means and said first detector means;
second emitter means, spaced from said first emitter means, for emitting a second disk position signal, the second emitter means disposed so that as the rotatable means rotates, respective intercepting means successively intercept the second disk position signal, said second emitter means being operable in a pulsed mode;
second detector means for detecting the transmission of the second disk position signal through respective signal transmission regions of said rotatable means, the second detector means disposed so that the intercepting means rotate between said second emitter means and said second detector means; and
means for determining a disk rotation direction change from the sequence of disk position signal transmission detected by said first detector means and said second detector means.

21. Apparatus in accordance with claim 20 wherein said first and second emitter means comprise respective light emitting diodes and said first and second detector means comprise respective light detectors.

22. Apparatus in accordance with claim 20 wherein said determining means determines a disk rotation direction change from respective sequences of pulses detected by said first and second detector means, a disk rotation state being indicated by whether said respective first and second detector means receive a respective pulse output by said respective first and second emitter means.

23. Apparatus in accordance with claim 22 wherein said means for determining a disk rotation direction change identifies no disk rotation direction change when three sequential disk rotation states are different.

24. Apparatus in accordance with claim 22 wherein said means for determining a disk rotation direction change identifies a disk rotation direction change when the first and third disk rotation states of three sequential disk rotation states are identical.

25. Apparatus in accordance with claim 20 further comprising means for storing respective pulses detected by said first and second detector means.

26. Apparatus, comprising rotatable means forming part of meter means, said rotatable means including a plurality of spaced signal transmission regions and a plurality of spaced signal intercepting means, at least two emitter/detector means, each emitter/detector means having a first and a second state of transmission, the emitter/detector means being disposed so that the signal intercepting means of said rotatable means rotate between the respective emitter means and the respective detector means of each emitter/detector means, said respective emitter means being operable in a pulsed mode, means for detecting the state of transmission of each emitter/detector means, and means for determining a change of disk rotation direction from the transmission state of the emitter/detector means.

27. Apparatus in accordance with claim 26 wherein the respective emitter means of each emitter/detector means comprise respective light emitting diodes and the respective detector means of each emitter/detector means comprise respective light detectors.

28. Apparatus in accordance with claim 26 wherein said determining means determines a disk rotation direction change from respective sequences of pulses detected by the respective detector means.

29. Apparatus in accordance with claim 28 wherein said determining means for determining a disk rotation direction change identifies no disk rotation change when three sequential transmission states are different.

30. Apparatus in accordance with claim 28 wherein said determining means for determining a disk rotation direction change identifies a disk rotation change when the first and third transmission states of three sequential transmission states are identical.

31. Apparatus in accordance with claim 26 further comprising means for storing respective pulses detected by the respective detector means.

* * * * *